United States Patent
Hikone et al.

(10) Patent No.: US 10,256,721 B2
(45) Date of Patent: *Apr. 9, 2019

(54) STEP-DOWN CHOPPER CIRCUIT INCLUDING A SWITCHING DEVICE CIRCUIT AND A BACKFLOW PREVENTION DIODE CIRCUIT

(71) Applicant: FUJI ELECTRIC CO., LTD., Kawasaki-shi, Kanagawa (JP)

(72) Inventors: Osamu Hikone, Machida (JP); Motoyoshi Kubouchi, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/414,970

(22) Filed: Jan. 25, 2017

(65) Prior Publication Data

US 2017/0264194 A1    Sep. 14, 2017

(30) Foreign Application Priority Data

Mar. 14, 2016 (JP) ................. 2016-049765

(51) Int. Cl.
  *H02M 3/156* (2006.01)
  *H02M 3/00* (2006.01)
  *H02M 3/158* (2006.01)
  *H01L 25/16* (2006.01)

(52) U.S. Cl.
  CPC ............ *H02M 3/156* (2013.01); *H02M 3/00* (2013.01); *H02M 3/158* (2013.01); *H01L 25/162* (2013.01)

(58) Field of Classification Search
  CPC ......... H02M 2001/0074; H02M 3/156; H02M 3/158; H02M 7/003; H01L 25/00; H01L 25/16; H01L 25/162
  See application file for complete search history.

(56) References Cited

U.S. PATENT DOCUMENTS

| | | | | |
|---|---|---|---|---|
| 5,321,299 A | * | 6/1994 | Ohkawa | H01L 25/16 257/528 |
| 5,932,995 A | * | 8/1999 | Wagoner | H02M 3/158 323/222 |
| 7,436,070 B2 | | 10/2008 | Uno et al. | |
| 7,863,756 B2 | | 1/2011 | Uno et al. | |
| 8,076,767 B2 | | 12/2011 | Uno et al. | |
| 8,482,345 B2 | | 7/2013 | Uno et al. | |
| 8,664,926 B2 | | 3/2014 | Nakatomi et al. | |
| 9,024,423 B2 | | 5/2015 | Muto et al. | |
| 2005/0156204 A1 | * | 7/2005 | Uno | H01L 25/165 257/213 |

(Continued)

FOREIGN PATENT DOCUMENTS

| | | |
|---|---|---|
| JP | H04-054864 A | 2/1992 |
| JP | H06-351113 A | 12/1994 |

(Continued)

*Primary Examiner* — Fred E Finch, III (74) *Attorney, Agent, or Firm* — Manabu Kanesaka (57) ABSTRACT

In a step-down chopper circuit, a distance between a plurality of first mounting portions of a first semiconductor package that houses a switching device circuit and a distance between a plurality of second mounting portions of a second semiconductor package that houses a backflow prevention diode circuit are different from each other.

12 Claims, 5 Drawing Sheets

(56) References Cited

U.S. PATENT DOCUMENTS

| | | | |
|---|---|---|---|
| 2005/0280490 A1* | 12/2005 | Uchiyama | H01R 13/2421 336/90 |
| 2007/0195563 A1* | 8/2007 | Shiraishi | H01L 24/49 363/25 |
| 2008/0304306 A1* | 12/2008 | Chang | H01L 25/16 363/147 |
| 2009/0251117 A1* | 10/2009 | Pigott | H02M 3/1584 323/272 |
| 2011/0181255 A1* | 7/2011 | Hashimoto | H02M 3/1588 323/272 |
| 2011/0188279 A1* | 8/2011 | Aiba | H02M 1/00 363/141 |
| 2011/0242861 A1 | 10/2011 | Ayukawa et al. | |
| 2012/0223926 A1 | 9/2012 | Morii et al. | |
| 2013/0026616 A1* | 1/2013 | Lee | H01L 23/4334 257/675 |
| 2013/0049137 A1* | 2/2013 | Uno | H01L 27/088 257/401 |
| 2014/0346659 A1* | 11/2014 | Nakamura | H02M 7/003 257/704 |
| 2015/0221622 A1* | 8/2015 | Lopez | H01L 25/16 257/676 |
| 2015/0223339 A1* | 8/2015 | Nakamura | H01L 23/3735 361/705 |
| 2016/0247751 A1* | 8/2016 | Kinzer | H01L 23/49575 |
| 2017/0093285 A1* | 3/2017 | Sasao | H02M 3/158 |
| 2017/0264197 A1* | 9/2017 | Kubouchi | H02M 3/158 |

FOREIGN PATENT DOCUMENTS

| | | |
|---|---|---|
| JP | 2005-310907 A | 11/2005 |
| JP | 2006-184456 A | 7/2006 |
| JP | 2010-239770 A | 10/2010 |
| JP | 2010-283236 A | 12/2010 |
| JP | 2011-217427 A | 10/2011 |
| JP | 2012-010514 A | 1/2012 |
| JP | 2015-226438 A | 12/2015 |
| WO | 2011/065051 A1 | 6/2011 |

* cited by examiner

STEP-DOWN CHOPPER CIRCUIT INCLUDING A SWITCHING DEVICE CIRCUIT AND A BACKFLOW PREVENTION DIODE CIRCUIT

CROSS-REFERENCE TO RELATED APPLICATION

The priority application number JP2016-049765, Step-Down Chopper Circuit, Mar. 14, 2016, Osamu Hikone and Motoyoshi Kubouchi, upon which this patent application is based, is hereby incorporated by reference.

BACKGROUND OF THE INVENTION

Field of the Invention

The present invention relates to a step-down chopper circuit, and more particularly, it relates to a step-down chopper circuit including a switching device circuit and a backflow prevention diode circuit.

Description of the Background Art

A step-down chopper circuit including a switching device circuit and a backflow prevention diode circuit is known in general, as disclosed in Japanese Patent Laying-Open No. 2010-239770.

Japanese Patent Laying-Open No. 2010-239770 discloses a DC-DC converter including switches and diodes that prevent current backflow. This DC-DC converter is configured to step down the voltage of regeneration power from an electrical rotating machine (rotating electrical machine) and apply the stepped-down voltage to a power source. The DC-DC converter also includes capacitors and a control circuit, and the control circuit controls on and off periods (duty) of the switches to control the charge and discharge amounts of the capacitors and step down the voltages. The diodes are arranged to prevent current backflow to the electrical rotating machine. Furthermore, in general, in this DC-DC converter, the switches and the diodes that prevent current backflow are housed in the same package.

However, in the conventional structure in which the switches (switching device circuit) and the diodes (backflow prevention diode circuit) that prevent current backflow are housed in the same package, the whole package is replaced even when one of the switching device circuit and the backflow prevention diode circuit fails. Thus, not only the failing device but also the device that is not failing is disadvantageously replaced. Therefore, in the DC-DC converter (step-down chopper circuit) described in Japanese Patent Laying-Open No. 2010-239770, the switching device circuit or the backflow prevention diode circuit that requires no replacement is disadvantageously replaced.

SUMMARY OF THE INVENTION

The present invention has been proposed in order to solve the aforementioned problem, and an object of the present invention is to provide a step-down chopper circuit capable of preventing replacement of a switching device circuit or a backflow prevention diode circuit that requires no replacement.

In order to attain the aforementioned object, a step-down chopper circuit according to an aspect of the present invention includes a reactor, a backflow prevention diode circuit connected to both ends of a capacitor circuit through the reactor, a switching device circuit connected in series to a direct-current output circuit between both ends of the backflow prevention diode circuit, a first semiconductor package that houses the switching device circuit, and a second semiconductor package that is provided separately from the first semiconductor package and houses the backflow prevention diode circuit. The first semiconductor package includes a plurality of first mounting portions that detachably mounts the first semiconductor package on a step-down chopper circuit body, the second semiconductor package includes a plurality of second mounting portions that detachably mounts the second semiconductor package on the step-down chopper circuit body, and a distance between the plurality of first mounting portions and a distance between the plurality of second mounting portions are different from each other. In general, the term "circuit" indicates a system of conductors connected to each other without an end, but in this description, the term "circuit" indicates a wider concept including the case where a "path of a current" has an end.

As hereinabove described, the step-down chopper circuit according to this aspect of the present invention includes the first semiconductor package that houses the switching device circuit and the second semiconductor package that is provided separately from the first semiconductor package and houses the backflow prevention diode circuit. Thus, when one of the switching device circuit and the backflow prevention diode circuit fails, only the first semiconductor package that houses the failing switching device circuit or the second semiconductor package that houses the failing backflow prevention diode circuit can be replaced, and hence replacement of the switching device circuit or the backflow prevention diode circuit that requires no replacement can be prevented. In this case, replacement of the switching device circuit or the backflow prevention diode circuit that requires no replacement is prevented, and hence an increase in replacement costs can be prevented. Furthermore, in the first semiconductor package and the second semiconductor package, the distance between the plurality of first mounting portions and the distance between the plurality of second mounting portions are different from each other, whereby the second semiconductor package (first semiconductor package) cannot be mounted on a location on which the first semiconductor package (second semiconductor package) is mounted. Thus, mixing up of the first semiconductor package and the second semiconductor package can be prevented when the first semiconductor package or the second semiconductor package is replaced. In addition, also at the time of manufacturing the step-down chopper circuit, mixing up of the first semiconductor package and the second semiconductor package can be prevented when the first semiconductor package and the second semiconductor package are mounted, and hence the productivity (production efficiency) of the step-down chopper circuit can be improved.

In the aforementioned step-down chopper circuit according to this aspect, the first semiconductor package and the second semiconductor package preferably have different shapes from each other. According to this structure, unlike the case where the first semiconductor package and the second semiconductor package have the same shape as each other, mixing up of the first semiconductor package and the second semiconductor package can be prevented when the first semiconductor package or the second semiconductor package is replaced. Furthermore, also at the time of manufacturing the step-down chopper circuit, mixing up of the first semiconductor package and the second semiconductor package can be prevented when the first semiconductor package and the second semiconductor package are mounted, and hence the productivity (production efficiency) of the step-down chopper circuit can be improved.

In the aforementioned step-down chopper circuit according to this aspect, the backflow prevention diode circuit preferably includes a backflow prevention diode that includes a wide band gap semiconductor. According to this structure, the backflow prevention diode that includes the wide band gap semiconductor is used such that a power loss (reverse recovery loss) in transient response of a state change can be reduced as compared with the case where a diode that includes a common silicon semiconductor is used. Consequently, a power loss can be reduced when the step-down chopper circuit is driven.

In the aforementioned step-down chopper circuit according to this aspect, the switching device circuit preferably includes a wide band gap semiconductor. According to this structure, the switching device circuit that includes the wide band gap semiconductor is used such that a switching loss can be reduced as compared with the case where a switching device circuit that includes a common silicon semiconductor is used. Consequently, a power loss can be reduced when the step-down chopper circuit is driven.

In the aforementioned step-down chopper circuit according to this aspect, the backflow prevention diode circuit preferably includes a first backflow prevention diode and a second backflow prevention diode connected in series to each other, the switching device circuit preferably includes a first switching device circuit connected in series to the first backflow prevention diode and a second switching device circuit connected in series to the second backflow prevention diode, the direct-current output circuit preferably includes a first direct-current output circuit and a second direct-current output circuit connected in series to each other, the first semiconductor package preferably includes one first semiconductor package that houses the first switching device circuit and the other first semiconductor package that is provided separately from the one first semiconductor package and houses the second switching device circuit, and the second semiconductor package preferably includes one second semiconductor package that houses the first backflow prevention diode and the other second semiconductor package that is provided separately from the one second semiconductor package and houses the second backflow prevention diode. According to this structure, the step-down chopper circuit can be configured as a three-level step-down chopper circuit, and when any of the first switching device circuit, the second switching device circuit, the first backflow prevention diode, and the second backflow prevention diode fails, replacement of the remaining devices that require no replacement can be prevented.

In the aforementioned step-down chopper circuit according to this aspect, the backflow prevention diode circuit preferably includes a first backflow prevention diode and a second backflow prevention diode connected in series to each other, the switching device circuit preferably includes a first switching device circuit connected in series to the first backflow prevention diode and a second switching device circuit connected in series to the second backflow prevention diode, the direct-current output circuit preferably includes a first direct-current output circuit and a second direct-current output circuit connected in series to each other, and both the first switching device circuit and the second switching device circuit are preferably housed in the first semiconductor package, or both the first backflow prevention diode and the second backflow prevention diode are preferably housed in the second semiconductor package. The possibility of failure of the first backflow prevention diode and the second backflow prevention diode is conceivably lower than the possibility of failure of the first switching device circuit and the second switching device circuit that include switching devices, which are connected to a control circuit and configured as active devices. Furthermore, when the switching device of one of the first switching device circuit and the second switching device circuit fails, the switching device of the other of the first switching device circuit and the second switching device circuit also conceivably fails. In view of this point, according to the present invention, both the first switching device circuit and the second switching device circuit are housed in the first semiconductor package, or both the first backflow prevention diode and the second backflow prevention diode are housed in the second semiconductor package. Thus, even when both the first backflow prevention diode and the second backflow prevention diode are housed in the second semiconductor package, the number of times of replacement of the second semiconductor package can be reduced due to the low possibility of failure. Even when both the first switching device circuit and the second switching device circuit are housed in the first semiconductor package, replacement of the switching device that requires no replacement can be prevented due to the high possibility that the first switching device circuit and the second switching device circuit fail simultaneously. Furthermore, the first semiconductor package or the second semiconductor package houses a plurality of devices, whereby an increase in the number of packages can be prevented, and hence an increase in the size (complication) of the step-down chopper circuit can be significantly reduced or prevented.

In this case, both the first backflow prevention diode and the second backflow prevention diode are preferably housed in the second semiconductor package. According to this structure, as compared with the case where the first backflow prevention diode and the second backflow prevention diode are housed in separate packages, the number of packages is not increased, and hence an increase in the size (complication) of the step-down chopper circuit can be significantly reduced or prevented. Although both the first backflow prevention diode and the second backflow prevention diode are housed in the second semiconductor package, the number of times of replacement of the second semiconductor package can be reduced due to the low possibility that the first backflow prevention diode and the second backflow prevention diode fail.

In the aforementioned step-down chopper circuit in which both the first switching device circuit and the second switching device circuit are housed in the first semiconductor package or both the first backflow prevention diode and the second backflow prevention diode are housed in the second semiconductor package, both the first switching device circuit and the second switching device circuit are preferably housed in the first semiconductor package. According to this structure, as compared with the case where the first switching device circuit and the second switching device circuit are housed in separate packages, the number of packages is not increased, and hence an increase in the size (complication) of the step-down chopper circuit can be significantly reduced or prevented. Although both the first switching device circuit and the second switching device circuit are housed in the first semiconductor package, replacement of the switching device that requires no replacement can be prevented due to the high possibility that the first switching device circuit and the second switching device circuit fail simultaneously.

In the aforementioned step-down chopper circuit in which both the first switching device circuit and the second switching device circuit are housed in the first semiconductor package or both the first backflow prevention diode and the second backflow prevention diode are housed in the second semiconductor package, both the first switching device circuit and the second switching device circuit that are likely to fail simultaneously are preferably housed in the first semiconductor package, or both the first backflow prevention diode and the second backflow prevention diode that are less likely to fail than the first switching device circuit and the second switching device circuit are preferably housed in the second semiconductor package. According to this structure, an increase in the number of packages can be prevented while replacement of the switching device circuit that requires no replacement is properly prevented on the basis of the possibility of failure or a failure mode.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are hereinafter described with reference to the drawings.

[First Embodiment]

The structure of a step-down chopper circuit 100 according to a first embodiment is now described with reference to FIGS. 1 and 2.

(Structure of Step-Down Chopper Circuit)

Figure 1:
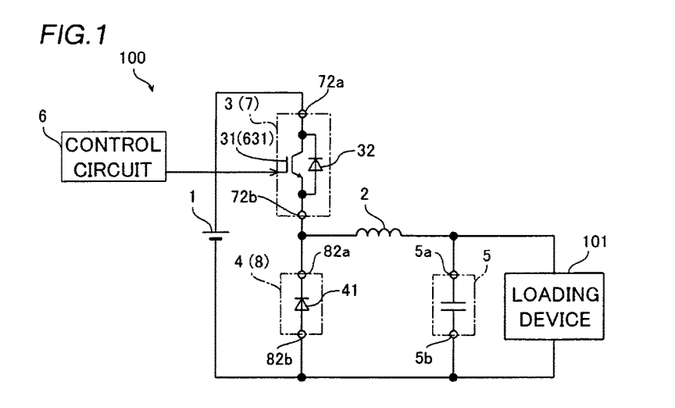
FIG. 1 is an electrical diagram showing the overall structure of a step-down chopper circuit according to a first embodiment of the present invention.

As shown in FIG. 1, the step-down chopper circuit 100 is configured to step down a voltage output from a direct-current output circuit 1 and supply the stepped-down voltage to a loading device 101. According to the first embodiment, the step-down chopper circuit 100 is configured as a so-called two-level step-down chopper circuit.

The direct-current output circuit 1 is configured to output a direct current as a direct-current power source, or includes an alternating-current power source and a rectifier circuit and is configured to output electric power having a rectification waveform obtained by rectifying an alternate current so as to output a direct current. When the alternating-current power source is configured as a rotating electrical machine, for example, the step-down chopper circuit 100 is configured to return electric power from the direct-current output circuit 1 (rotating electrical machine) to the loading device 101 (power source).

The step-down chopper circuit 100 includes a reactor 2, a switching device circuit 3, a backflow prevention diode circuit 4, a capacitor 5, and a control circuit 6. In general, the term "circuit" indicates a system of conductors connected to each other without an end, but in this description, the term "circuit" indicates a wider concept including the case where a "path of a current" has an end. The capacitor 5 is an example of the "capacitor circuit" in the claims, and may include one or more capacitors.

According to the first embodiment, the switching device circuit 3 is connected in series to the direct-current output circuit 1, as shown in FIG. 1. The switching device circuit 3 includes a switching device 31 and a diode 32. Specifically, the switching device 31 is configured as a switching device such as an IGBT (insulated gate bipolar transistor), a MOSFET, or a transistor that includes a silicon semiconductor. For example, in FIG. 1, the switching device 31 is illustrated as an IGBT. According to the first embodiment, the diode 32 (reverse bias prevention diode) includes a silicon semiconductor. The diode 32 is an example of the "antiparallel diode" in the claims.

A collector of the switching device 31 is connected to a positive pole of the direct-current output circuit 1 and is connected to a cathode of the diode 32. An emitter of the switching device 31 is connected to an anode of the diode 32, a first end of the reactor 2, and a cathode of a diode 41 of the backflow prevention diode circuit 4. In other words, according to the first embodiment, the diode 32 is connected in anti-parallel to the switching device 31. The diode 41 is an example of the "backflow prevention diode" in the claims.

The backflow prevention diode circuit 4 is connected to both ends of the capacitor 5 through the reactor 2, and the backflow prevention diode circuit 4, the reactor 2, and the capacitor 5 form a series circuit. According to the first embodiment, the backflow prevention diode circuit 4 includes the diode 41, and the diode 41 includes a wide band gap semiconductor. Specifically, the diode 41 includes a semiconductor device, the band gap of which is larger (wider) than that of a silicon semiconductor such as SiC, GaN, diamond, AlN, AlGaN, or ZnO.

The capacitor 5 is connected to between both ends of the loading device 101. Specifically, a second end of the reactor 2 is connected to a positive terminal 5a of the capacitor 5, and an anode of the diode 41 of the backflow prevention diode circuit 4 and a negative pole of the direct-current output circuit 1 are connected to a negative terminal 5b of the capacitor 5.

The control circuit 6 is connected to a gate of the switching device 31 of the switching device circuit 3, and is configured to control a time ratio of turning on and turning off (switching operation) of the switching device 31 of the switching device circuit 3. The control circuit 6 is configured to be capable of adjusting (controlling) a voltage value (voltage bucking) and a current value (a value of a current that flows in the reactor 2) of the step-down chopper circuit 100 with respect to the loading device 101 by controlling the time ratio of turning on and turning off of the switching device circuit 3.

The loading device 101 may be configured as a battery (direct-current power source) or a combination of an inverter including a plurality of switching devices and an electric motor, for example. When the loading device 101 is configured as a battery, the loading device 101 is configured to be charged by electric power (regenerative electric power) from the direct-current output circuit 1. When the loading device 101 includes an electric motor, the loading device 101 is configured to consume electric power to be driven.

<Structures of First Semiconductor Package and Second Semiconductor Package>

Figure 2:
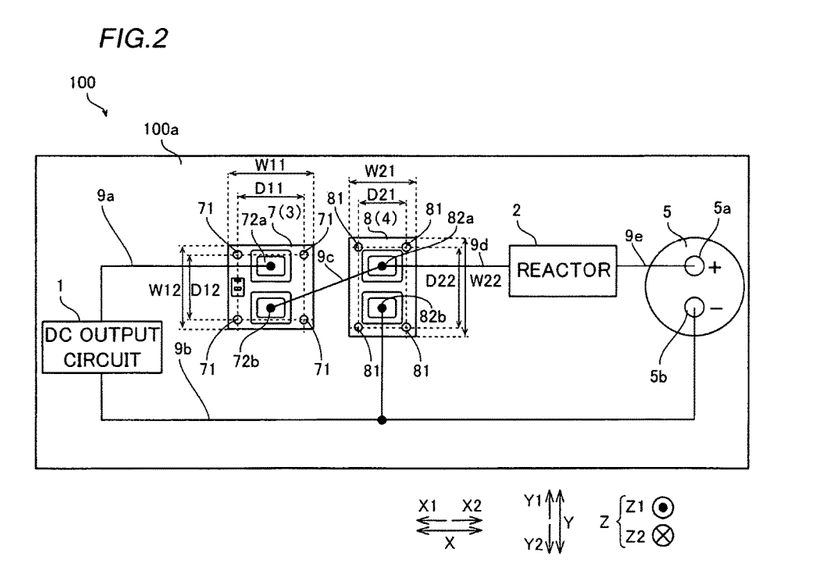
FIG. 2 is a plan view schematically showing the structure of the step-down chopper circuit according to the first embodiment of the present invention.

According to the first embodiment, the step-down chopper circuit 100 includes a first semiconductor package 7 and a second semiconductor package 8, as shown in FIG. 2. Specifically, the step-down chopper circuit 100 includes a step-down chopper circuit body 100a. The step-down chopper circuit body 100a may be configured as a printed circuit board or a heatsink, for example. In an example shown in FIG. 2, the step-down chopper circuit body 100a is illustrated as a single member, but the step-down chopper circuit body 100a is not restricted to a single printed circuit board or heatsink. The step-down chopper circuit body 100a may include a plurality of printed circuit boards or a plurality of heatsinks (or a combination of these).

According to the first embodiment, the first semiconductor package 7 houses the switching device circuit 3. Specifically, the first semiconductor package 7 is obtained by mounting the switching device circuit 3 on a base of metal such as copper through an insulating layer and covering it with a resin case after wiring, for example.

As shown in FIG. 2, the first semiconductor package 7 includes a plurality of mounting portions 71 and terminals 72a and 72b. Specifically, the first semiconductor package 7 includes the plurality of mounting portions 71 that detachably mounts the first semiconductor package 7 on the step-down chopper circuit body 100a. The mounting portions 71 are configured as through-holes in which unshown fixing members such as screws can be arranged, for example. Thus, the first semiconductor package 7 is detachable (replaceable) from the step-down chopper circuit body 100a.

The step-down chopper circuit 100 includes wires 9a to 9e, and the terminal 72a is connected to the wire 9a that is connected to the positive pole of the direct-current output circuit 1. The terminal 72b is connected to the wire 9c that is connected to a terminal 82a of the second semiconductor package 8. A conductor (such as a solder) may be welded to a connection portion between the terminal 72a and the wire 9a and a connection portion between the terminal 72b and the wire 9c so that the terminal 72a is bonded to the wire 9a and the terminal 72b is bonded to the wire 9c, or bolts or the like made of metal may be screwed into nuts provided inside the terminals 72a and 72b such that the wires 9a and 9c are sandwiched between the nuts and the bolts, for example. The term "wire" is used, but it is not restricted to a cable-like (linear) member. A wiring plate may be used.

According to the first embodiment, the step-down chopper circuit 100 includes the second semiconductor package 8 that is provided separately from the first semiconductor package 7 and houses the backflow prevention diode circuit 4. Specifically, the second semiconductor package 8 internally houses the diode 41 spaced apart from the first semiconductor package 7, which the backflow prevention diode circuit 4 includes.

According to the first embodiment, the first semiconductor package 7 and the second semiconductor package 8 have different shapes from each other. Specifically, the widths (W11 and W21) of the first semiconductor package 7 and the second semiconductor package 8 in a direction parallel to an X-axis and the widths (W12 and W22) of the first semiconductor package 7 and the second semiconductor package 8 in a direction parallel to a Y-axis are different from each other in a plan view (as viewed from a Z1 direction side), as shown in FIG. 2.

More specifically, the first semiconductor package 7 has a rectangular shape in a plan view. The first semiconductor package 7 has the width W11 in the direction parallel to the X-axis and the width W12 in the direction parallel to the Y-axis, for example. The second semiconductor package 8 has a rectangular shape in a plan view. The second semiconductor package 8 has the width W21 that is smaller than the width W11 in the direction parallel to the X-axis and the width W22 that is larger than the width W12 in the direction parallel to the Y-axis, for example.

The second semiconductor package 8 includes a plurality of mounting portions 81 and terminals 82a and 82b. The mounting portions 81 are configured similarly to the mounting portions 71, and the second semiconductor package 8 is detachable (replaceable) from the step-down chopper circuit body 100a by the mounting portions 81. The terminal 82a is connected to the wire 9c. Therefore, the terminal 82a of the second semiconductor package 8 and the terminal 72b of the first semiconductor package 7 are connected to each other through the wire 9c. The terminal 82b is connected to the wire 9b that is connected to the negative pole of the direct-current output circuit 1 and the negative terminal 5b of the capacitor 5.

According to the first embodiment, in the first semiconductor package 7 and the second semiconductor package 8, a distance D11 between the plurality of mounting portions 71 and a distance D21 between the plurality of mounting portions 81 are different from each other in the direction parallel to the X-axis. Furthermore, in the first semiconductor package 7 and the second semiconductor package 8, a distance D12 between the plurality of mounting portions 71 and a distance D22 between the plurality of mounting portions 81 are different from each other in the direction parallel to the Y-axis.

According to the first embodiment, the first semiconductor package 7 and the second semiconductor package 8 are replaceable individually from the step-down chopper circuit 100 (step-down chopper circuit body 100a).

The first end of the reactor 2 is connected to the wire 9d, and the second end of the reactor 2 is connected to the wire 9e. The capacitor 5 includes the positive terminal 5a and the negative terminal 5b, as shown in FIG. 2. The positive terminal 5a is connected to the wire 9e that is connected to the second end of the reactor 2, and the negative terminal 5b is connected to the wire 9b. In other words, the capacitor 5 is connected to the terminal 82b of the second semiconductor package 8 and the negative pole of the direct-current output circuit 1 through the wire 9b.

(Operation of Step-Down Chopper Circuit)

The operation of the step-down chopper circuit 100 according to the first embodiment is now described with reference to FIG. 1. The operation of the step-down chopper circuit 100 is performed by control processing of the control circuit 6.

When the switching device 31 is turned on, a current flows into the direct-current output circuit 1, the switching device 31, the reactor 2, and the capacitor 5. On the other hand, in this case, almost no current flows into the diode 32.

When the switching device 31 is turned off, the diode 41 (backflow prevention diode circuit 4) conducts, and a current flows into the diode 41, the reactor 2, and the capacitor 5. On the other hand, in this case, almost no current flows into the diode 32.

When the switching device 31 is then turned on, the diode 41 (backflow prevention diode circuit 4) changes from a conducting state to a non-conducting state, and a current flows again into the above direct-current output circuit 1, switching device 31, reactor 2, and capacitor 5. In this case, a reverse recovery loss is caused in the backflow prevention diode circuit 4 (diode 41). The diode 41 includes the wide band gap semiconductor, and hence a reverse recovery loss is reduced as compared with the case where the diode includes a silicon semiconductor.

During steady operation, the switching device 31 is switched on and off at a fixed time ratio, the amount of rise in the current value of the reactor 2 in the case where the switching device 31 is switched on balances the amount of drop in the current value of the reactor 2 in the case where the switching device 31 is switched off, the value of the current that flows in the reactor 2 is larger than the value of the current that flows in the direct-current output circuit 1, and the voltage value of the capacitor 5 (positive terminal 5a) becomes a substantially constant and stepped-down direct-current voltage value that is less than the voltage value of the direct-current output circuit 1.

In the step-down chopper circuit 100 that performs the above operation, the switching device 31 can fail. Even when the switching device 31 fails, the diode 41 may not fail. In this case, in the step-down chopper circuit 100, the second semiconductor package 8 is not replaced, but only the first semiconductor package 7 that houses the failing switching device 31 is replaced. In this case, when the diode 41 includes the wide band gap semiconductor, an effect of preventing an increase in replacement costs becomes prominent. The diode 32 includes the silicon semiconductor, and hence an increase in replacement costs is suppressed even when the diode 32 is replaced together with the switching device 31.

Furthermore, in the step-down chopper circuit 100 that performs the above operation, the diode 41 can fail due to reverse recovery surge or the like. Even when the diode 41 fails, the switching device 31 may not fail. When the switching device 31 is turned off by the control circuit 6 before a value of a current that flows in the switching device 31 exceeds a short circuit resistance, for example, the switching device 31 does not fail. In this case, in the step-down chopper circuit 100, the first semiconductor package 7 is not replaced, but only the second semiconductor package 8 that houses the failing diode 41 is replaced. In this case, when the switching device 31 (switching device 631) includes a wide band gap semiconductor as in a modification described later, an effect of preventing an increase in replacement costs becomes prominent.

[Effects of First Embodiment]

According to the first embodiment, the following effects can be obtained.

According to the first embodiment, as hereinabove described, the step-down chopper circuit 100 includes the first semiconductor package 7 that houses the switching device circuit 3 and the second semiconductor package 8 that is provided separately from the first semiconductor package 7 and houses the backflow prevention diode circuit 4. Thus, when one of the switching device circuit 3 and the backflow prevention diode circuit 4 fails, only the first semiconductor package 7 that houses the failing switching device circuit 3 or the second semiconductor package 8 that houses the failing backflow prevention diode circuit 4 can be replaced, and hence replacement of the switching device circuit 3 or the backflow prevention diode circuit 4 that requires no replacement can be prevented. Replacement of the switching device circuit 3 or the backflow prevention diode circuit 4 that requires no replacement is prevented, and hence an increase in replacement costs can be prevented.

According to the first embodiment, as hereinabove described, the first semiconductor package 7 includes the plurality of mounting portions 71 that detachably mounts the first semiconductor package 7 on the step-down chopper circuit body 100a. The second semiconductor package 8 includes the plurality of mounting portions 81 that detachably mounts the second semiconductor package 8 on the step-down chopper circuit body 100a. In the first semiconductor package 7 and the second semiconductor package 8, the distances between the plurality of mounting portions 71 and the distances between the plurality of mounting portions 81 are different from each other. Thus, the second semiconductor package 8 (first semiconductor package 7) cannot be mounted on a location on which the first semiconductor package 7 (second semiconductor package 8) is mounted. Thus, mixing up of the first semiconductor package 7 and the second semiconductor package 8 can be prevented when the first semiconductor package 7 or the second semiconductor package 8 is replaced. Furthermore, also at the time of manufacturing the step-down chopper circuit 100, mixing up of the first semiconductor package 7 and the second semiconductor package 8 can be prevented when the first semiconductor package 7 and the second semiconductor package 8 are mounted, and hence the productivity (production efficiency) of the step-down chopper circuit 100 can be improved.

According to the first embodiment, as hereinabove described, the first semiconductor package 7 and the second semiconductor package 8 have the different shapes from each other. Thus, unlike the case where the first semiconductor package 7 and the second semiconductor package 8 have the same shape as each other, mixing up of the first semiconductor package 7 and the second semiconductor package 8 can be prevented when the first semiconductor package 7 or the second semiconductor package 8 is replaced. Furthermore, also at the time of manufacturing the step-down chopper circuit 100, mixing up of the first semiconductor package 7 and the second semiconductor package 8 can be prevented when the first semiconductor package 7 and the second semiconductor package 8 are mounted, and hence the productivity (production efficiency) of the step-down chopper circuit 100 can be improved.

According to the first embodiment, as hereinabove described, the backflow prevention diode circuit 4 includes the diode 41 that includes the wide band gap semiconductor, and the switching device circuit 3 includes the switching device 31 and the diode 32 that is connected in anti-parallel to the switching device 31 and includes the silicon semiconductor. Thus, the diode 41 that includes the wide band gap semiconductor is used such that a power loss (reverse recovery loss) in transient response of a state change can be reduced as compared with the case where a diode that includes a common silicon semiconductor is used. Consequently, a power loss can be reduced when the step-down chopper circuit 100 is driven. Unlike the diode 41 that the backflow prevention diode circuit 4 includes, almost no current flows into the diode 32 that is connected in anti-parallel to the switching device 31, and hence an increase in a power loss can be suppressed even when the diode 32 includes the silicon semiconductor.

[Second Embodiment]

The structure of a step-down chopper circuit 200 according to a second embodiment is now described with reference to FIGS. 3 and 4. In the second embodiment, the step-down chopper circuit 200 is configured as a three-level step-down chopper circuit unlike the step-down chopper circuit 100 configured as the two-level step-down chopper circuit. Portions of the step-down chopper circuit 200 similar to those of the step-down chopper circuit 100 according to the aforementioned first embodiment are denoted by the same reference numerals, to omit the description.

(Structure of Step-Down Chopper Circuit According to Second Embodiment)

Figure 3:
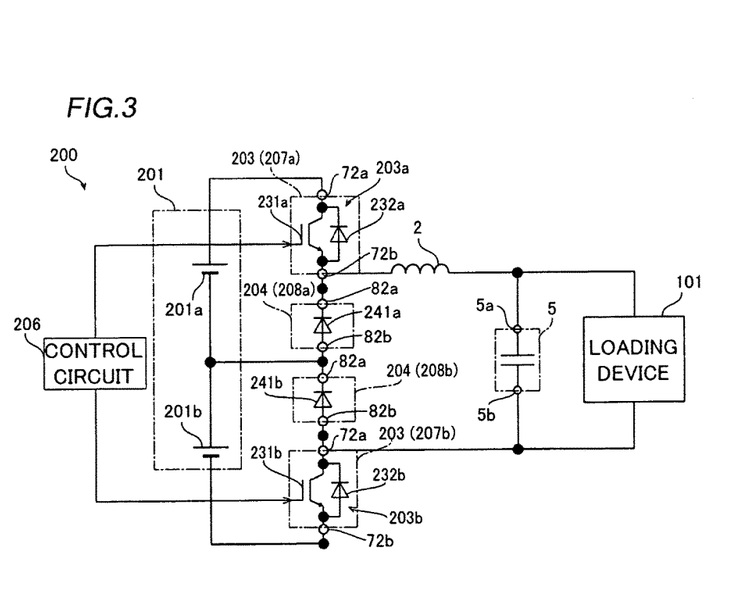
FIG. 3 is an electrical diagram showing the overall structure of a step-down chopper circuit according to a second embodiment of the present invention.
Figure 4:
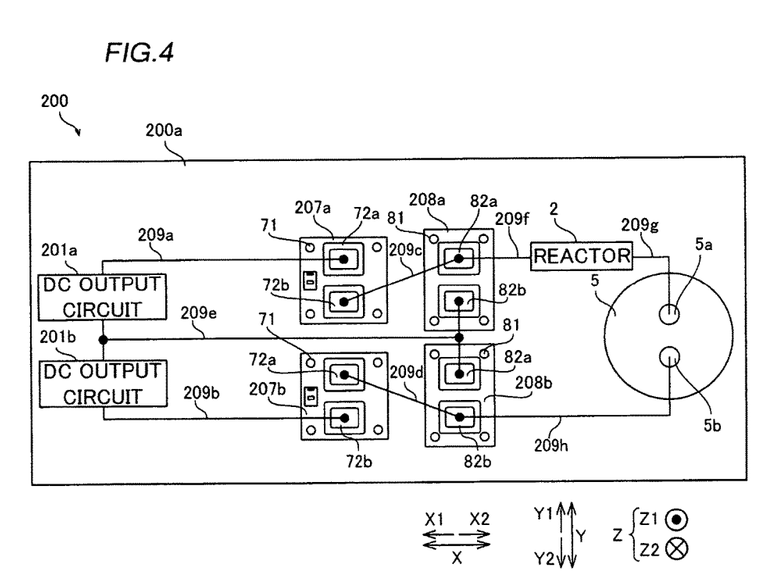
FIG. 4 is a plan view schematically showing the structure of the step-down chopper circuit according to the second embodiment of the present invention.

As shown in FIGS. 3 and 4, the step-down chopper circuit 200 according to the second embodiment includes a direct-current output circuit 201, a switching device circuit 203, a backflow prevention diode circuit 204, and a control circuit 206. The step-down chopper circuit 200 is configured as the three-level step-down chopper circuit.

The step-down chopper circuit 200 includes first semiconductor packages 207a and 207b and second semiconductor packages 208a and 208b.

As shown in FIG. 3, the direct-current output circuit 201 includes a first direct-current output circuit 201a and a second direct-current output circuit 201b connected in series to each other. The backflow prevention diode circuit 204 includes diodes 241a and 241b connected in series to each other. Specifically, an anode of the diode 241a and a cathode of the diode 241b are connected to each other. The diodes 241a and 241b each include a wide band gap semiconductor. The diode 241a is an example of the "first backflow prevention diode" in the claims. The diode 241b is an example of the "second backflow prevention diode" in the claims.

The switching device circuit 203 includes a first switching device circuit 203a connected in series to the diode 241a and a second switching device circuit 203b connected in series to the diode 241b. Specifically, the first switching device circuit 203a includes a first switching device 231a and a diode 232a connected in anti-parallel to the first switching device 231a. The second switching device circuit 203b includes a second switching device 231b and a diode 232b connected in anti-parallel to the second switching device 231b. The diodes 232a and 232b each include a silicon semiconductor. The diodes 232a and 232b are examples of the "antiparallel diode" in the claims.

The first switching device circuit 203a is connected to between a positive pole of the first direct-current output circuit 201a and a reactor 2. The second switching device circuit 203b is connected to between a negative pole of the second direct-current output circuit 201b and a capacitor 5 (negative terminal 5b).

The anode of the diode 241a and the cathode of the diode 241b are connected to a negative pole of the first direct-current output circuit 201a and a positive pole of the second direct-current output circuit 201b. A cathode of the diode 241a is connected to a first end of the reactor 2, and an anode of the diode 241b is connected to the negative terminal 5b of the capacitor 5. Thus, the backflow prevention diode circuit 204 (diodes 241a and 241b), the reactor 2, and the capacitor 5 form a series circuit.

The first semiconductor package 207a houses the first switching device circuit 203a. In other words, the first semiconductor package 207a houses both the first switching device 231a and the diode 232a. The first semiconductor package 207b is provided separately from the first semiconductor package 207a and houses the second switching device circuit 203b. In other words, the first semiconductor package 207b houses both the second switching device 231b and the diode 232b.

The second semiconductor package 208a houses the diode 241a. The second semiconductor package 208b is provided separately from the second semiconductor package 208a and houses the diode 241b.

In other words, according to the second embodiment, the first switching device circuit 203a, the second switching device circuit 203b, the diode 241a, and the diode 241b are housed in the separate packages.

<Structures of First Semiconductor Packages and Second Semiconductor Packages>

As shown in FIG. 4, the first semiconductor packages 207a and 207b have substantially the same shape as each other. The second semiconductor packages 208a and 208b have substantially the same shape as each other. The first semiconductor package 207a and the second semiconductor package 208a have different shapes from each other. For example, the first semiconductor packages 207a and 207b have the same shape as that of the first semiconductor package 7 according to the first embodiment. The second semiconductor packages 208a and 208b have the same shape as that of the second semiconductor package 8 according to the first embodiment.

The step-down chopper circuit 200 includes a step-down chopper circuit body 200a, and the first semiconductor packages 207a and 207b and the second semiconductor packages 208a and 208b are individually mounted on the step-down chopper circuit body 200a. The first semiconductor packages 207a and 207b and the second semiconductor packages 208a and 208b are spaced apart from each other. The first semiconductor packages 207a and 207b and the second semiconductor packages 208a and 208b are replaceable (detachable) individually from the step-down chopper circuit body 200a.

The step-down chopper circuit 200 includes wires 209a to 209h. The wire 209a is connected with the first direct-current output circuit 201a and the first semiconductor package 207a. The wire 209b is connected with the second direct-current output circuit 201b and the first semiconductor package 207b. The wire 209c is connected with the first semiconductor package 207a and the second semiconductor package 208a. The wire 209d is connected with the first semiconductor package 207b and the second semiconductor package 208b.

The wire 209e is connected with the first direct-current output circuit 201a, the second direct-current output circuit 201b, and the second semiconductor packages 208a and 208b. The wire 209f is connected with the second semiconductor package 208a and the first end of the reactor 2. The wire 209g is connected with a second end of the reactor 2 and a positive terminal 5a of the capacitor 5. The wire 209h is connected with the negative terminal 5b of the capacitor 5 and the second semiconductor package 208b. Thus, the three-level step-down chopper circuit is formed in the step-down chopper circuit body 200a.

The remaining structures of the step-down chopper circuit 200 according to the second embodiment are similar to those of the step-down chopper circuit 100 according to the first embodiment.

(Operation of Step-Down Chopper Circuit According to Second Embodiment)

The operation of the step-down chopper circuit 200 according to the second embodiment is now described with reference to FIG. 3. The operation of the step-down chopper circuit 200 is performed by control processing of the control circuit 206.

When the first switching device 231a is turned on and the second switching device 231b is turned on, a current flows into the first direct-current output circuit 201a, the second direct-current output circuit 201b, the first switching device 231a, the second switching device 231b, the reactor 2, and the capacitor 5. On the other hand, in this case, almost no current flows into the diodes 232a and 232b.

When the first switching device 231a is turned on and the second switching device 231b is turned off, a current flows into the first direct-current output circuit 201a, the first switching device 231a, the reactor 2, the capacitor 5, and the diode 241b. On the other hand, also in this case, almost no current flows into the diodes 232a and 232b.

When the first switching device 231a is turned off and the second switching device 231b is turned on, a current flows into the second direct-current output circuit 201b, the diode 241a, the reactor 2, the capacitor 5, and the second switching device 231b. On the other hand, also in this case, almost no current flows into the diodes 232a and 232b.

When the first switching device 231a is turned off and the second switching device 231b is turned off, a current flows into the diodes 241a and 241b, the reactor 2, and the capacitor 5. On the other hand, also in this case, almost no current flows into the diodes 232a and 232b.

The above on-off operation of the first switching device 231a and the second switching device 231b is repeated such that the current value of the capacitor 5 (positive terminal 5a) is smaller than the sum of the current value of the first direct-current output circuit 201a and the current value of the second direct-current output circuit 201b, and the magnitude of a time ratio is controlled.

Therefore, whereas a reverse recovery loss is caused in the diodes 241a and 241b, almost no current flows into the diodes 232a and 232b so that almost no power loss is caused in the diodes 232a and 232b.

In the step-down chopper circuit 200 that performs the above operation, one (first switching device 231a, for example) of the first switching device 231a and the second switching device 231b can fail. In this case, the other (second switching device 231b) of the first switching device 231a and the second switching device 231b and the diodes 241a and 241b may not fail. In this case, in the step-down chopper circuit 200, the first semiconductor package 207b and the second semiconductor packages 208a and 208b are not replaced, but only the first semiconductor package 207a that houses the failing first switching device 231a is replaced.

Furthermore, in the step-down chopper circuit 200 that performs the above operation, one (diode 241a, for example) of the diodes 241a and 241b can fail due to reverse recovery surge. In this case, only the second semiconductor package 208a that houses the failing diode 241a is replaced.

[Effects of Second Embodiment]

According to the second embodiment, the following effects can be obtained.

According to the second embodiment, as hereinabove described, the backflow prevention diode circuit 204 includes the diodes 241a and 241b connected in series to each other. The switching device circuit 203 includes the first switching device circuit 203a connected in series to the diode 241a and the second switching device circuit 203b connected in series to the diode 241b. The direct-current output circuit 201 includes the first direct-current output circuit 201a and the second direct-current output circuit 201b connected in series to each other. The step-down chopper circuit 200 includes the first semiconductor package 207a that houses the first switching device circuit 203a and the first semiconductor package 207b that is provided separately from the first semiconductor package 207a and houses the second switching device circuit 203b. Furthermore, the step-down chopper circuit 200 includes the second semiconductor package 208a that houses the diode 241a and the second semiconductor package 208b that is provided separately from the second semiconductor package 208a and houses the diode 241b. Thus, the step-down chopper circuit 200 can be configured as the three-level step-down chopper circuit, and when any of the first switching device circuit 203a, the second switching device circuit 203b, the diode 241a, and the diode 241b fails, replacement of the remaining devices that require no replacement can be prevented.

The remaining effects of the step-down chopper circuit 200 according to the second embodiment are similar to those of the step-down chopper circuit 100 according to the first embodiment.

[Third Embodiment]

The structure of a step-down chopper circuit 300 according to a third embodiment is now described with reference to FIGS. 5 and 6. In the third embodiment, the step-down chopper circuit 300 is configured as a three-level step-down chopper circuit similarly to the second embodiment. On the other hand, in the third embodiment, both diodes 341a and 341b are housed in a second semiconductor package 308 unlike the second embodiment in which the diodes 241a and 241b are housed in the separate semiconductor packages. Portions of the step-down chopper circuit 300 similar to those of the step-down chopper circuits 100 and 200 according to the aforementioned first and second embodiments are denoted by the same reference numerals, to omit the description.

(Structure of Step-Down Chopper Circuit According to Third Embodiment)

Figure 5:
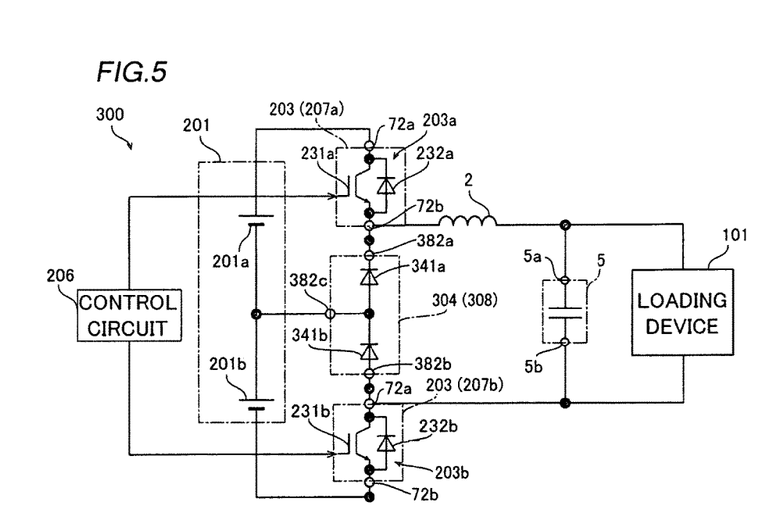
FIG. 5 is an electrical diagram showing the overall structure of a step-down chopper circuit according to a third embodiment of the present invention.
Figure 6:
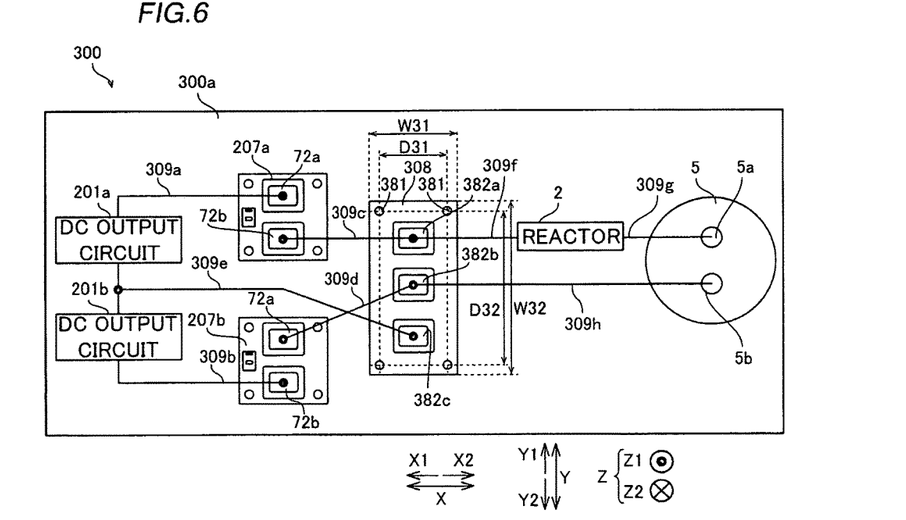
FIG. 6 is a plan view schematically showing the structure of the step-down chopper circuit according to the third embodiment of the present invention.

As shown in FIGS. 5 and 6, the step-down chopper circuit 300 according to the third embodiment includes first semiconductor packages 207a and 207b and the second semiconductor package 308. The second semiconductor package 308 houses both the diodes 341a and 341b (backflow prevention diode circuit 304). The second semiconductor package 308 is replaceably mounted on a step-down chopper circuit body 300a.

According to the third embodiment, in the first semiconductor packages 207a and 207b and the second semiconductor package 308, distances D11 (see FIG. 2) between pluralities of mounting portions 71 and a distance D31 between a plurality of mounting portions 381 are different from each other in a direction parallel to an X-axis. Furthermore, in the first semiconductor packages 207a and 207b and the second semiconductor package 308, distances D12 (see FIG. 2) between the pluralities of mounting portions 71 and a distance D32 between the plurality of mounting portions 381 are different from each other in a direction parallel to a Y-axis.

The possibility of failure of the diodes 341a and 341b (passive devices) is conceivably lower than the possibility of failure of a first switching device 231a and a second switching device 231b that are connected to a control circuit 206 and function as active devices. In other words, the frequency of replacement of the diodes 341a and 341b is conceivably smaller than the frequency of replacement of the first switching device 231a and the second switching device 231b.

According to the third embodiment, both the diodes 341a and 341b are housed in the second semiconductor package 308 on the basis of the above possibility of failure of the diodes 341a and 341b.

As shown in FIG. 6, also according to the third embodiment, the first semiconductor packages 207a and 207b and the second semiconductor package 308 are separate from each other, and have different shapes from each other. The second semiconductor package 308 includes the mounting portions 381 and terminals 382a to 382c. The second semiconductor package 308 is mounted on the step-down chopper circuit body 300a by the mounting portions 381.

As shown in FIG. 5, the terminal 382a is connected to a cathode of the diode 341a. The terminal 382b is connected to an anode of the diode 341b. The terminal 382c is connected to an anode of the diode 341a and a cathode of the diode 341b.

The step-down chopper circuit 300 includes wires 309a to 309h, and a circuit configuration shown in FIG. 5 is formed by connections of the wires 309a to 309h. Specifically, the wire 309a is connected to a first direct-current output circuit 201a and the first semiconductor package 207a. The wire 309b is connected to a second direct-current output circuit 201b and the first semiconductor package 207b. The wire 309c is connected to a terminal 72b of the first semiconductor package 207a and the terminal 382a of the second semiconductor package 308. The wire 309d is connected to a terminal 72a of the first semiconductor package 207b and the terminal 382b of the second semiconductor package 308. The wire 309e is connected to the first direct-current output circuit 201a, a second direct-current output circuit 201b, and the terminal 382c of the second semiconductor package 308.

The wire 309f is connected to the terminal 382a of the second semiconductor package 308 and a reactor 2. The wire 309g is connected to the reactor 2 and a capacitor 5. The wire 309h is connected to the capacitor 5 and the terminal 382c of the second semiconductor package 308.

The remaining structures of the step-down chopper circuit 300 according to the third embodiment are similar to those of the step-down chopper circuit 200 according to the second embodiment. The operation of the step-down chopper circuit 300 according to the third embodiment is similar to the operation of the step-down chopper circuit 200 according to the second embodiment.

[Effects of Third Embodiment]

According to the third embodiment, the following effects can be obtained.

According to the third embodiment, as hereinabove described, both the diodes 341a and 341b are housed in the second semiconductor package 308. The possibility of failure of the diodes 341a and 341b is conceivably lower than the possibility of failure of the first switching device 231a and the second switching device 231b, which are connected to the control circuit 206 and configured as active devices. In view of this point, according to the third embodiment, even when both the diodes 341a and 341b are housed in the second semiconductor package 308, the number of times of replacement of the second semiconductor package 308 can be reduced due to the low possibility of failure. Furthermore, as compared with the case where the diodes 341a and 341b are housed in separate packages, the number of packages is not increased, and hence an increase in the size (complication) of the step-down chopper circuit 300 can be significantly reduced or prevented.

According to the third embodiment, as hereinabove described, both the diodes 341a and 341b are housed in the second semiconductor package 308 on the basis of at least one (the possibility of failure) of the possibility of failure of the diodes 341a and 341b and a failure mode. Thus, an increase in the number of packages can be prevented while replacement of the switching device that requires no replacement is properly prevented on the basis of at least one of the possibility of failure and the failure mode.

The remaining effects of the step-down chopper circuit 300 according to the third embodiment are similar to those of the step-down chopper circuit 100 according to the first embodiment.

[Fourth Embodiment]

The structure of a step-down chopper circuit 400 according to a fourth embodiment is now described with reference to FIGS. 7 and 8. In the fourth embodiment, the step-down chopper circuit 400 is configured as a three-level step-down chopper circuit similarly to the second embodiment. On the other hand, in the fourth embodiment, both a first switching device circuit 403a and a second switching device circuit 403b are housed in a first semiconductor package 407 unlike the second embodiment in which the first switching device circuit 203a and the second switching device circuit 203b are housed in the separate semiconductor packages. Portions of the step-down chopper circuit 400 similar to those of the step-down chopper circuits 100 to 300 according to the aforementioned first to third embodiments are denoted by the same reference numerals, to omit the description.

(Structure of Step-Down Chopper Circuit According to Fourth Embodiment)

Figure 7:
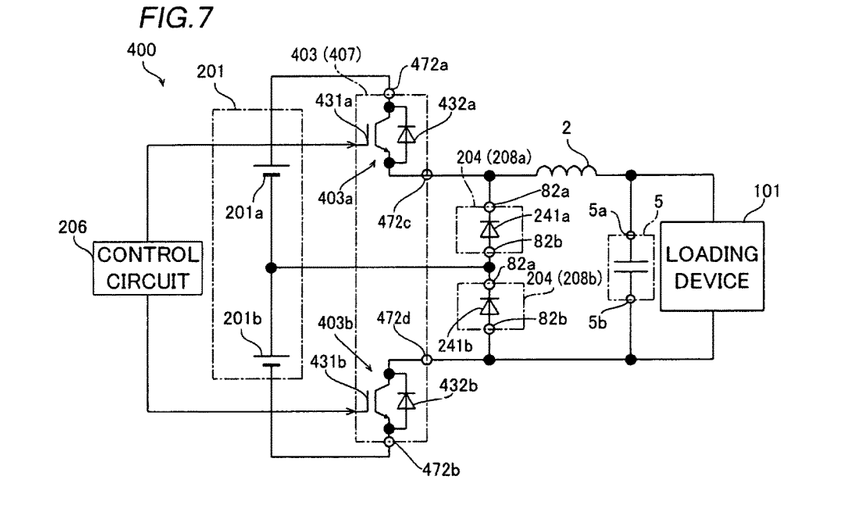
FIG. 7 is an electrical diagram showing the overall structure of a step-down chopper circuit according to a fourth embodiment of the present invention.
Figure 8:
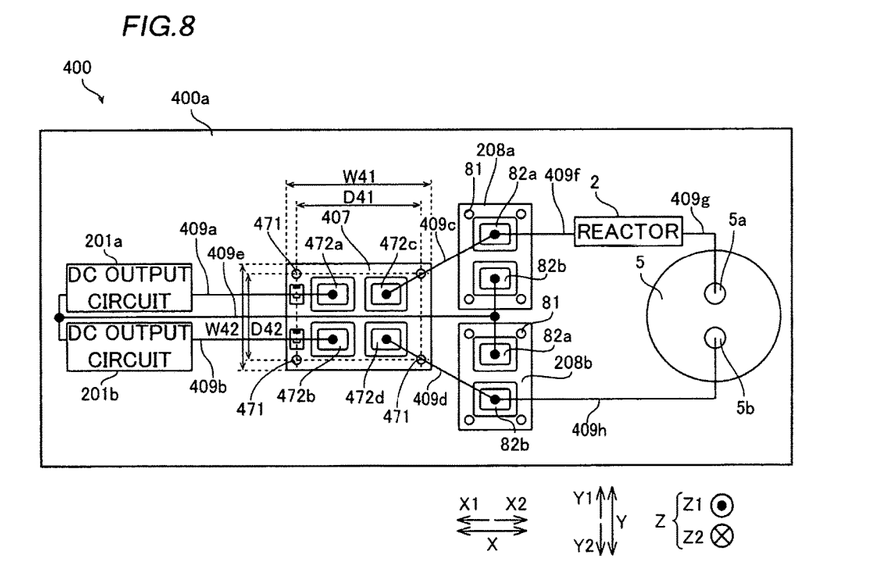
FIG. 8 is a plan view schematically showing the structure of the step-down chopper circuit according to the fourth embodiment of the present invention.

The step-down chopper circuit 400 according to the fourth embodiment includes the first semiconductor package 407 and second semiconductor packages 208a and 208b, as shown in FIGS. 7 and 8. Both the first switching device circuit 403a and the second switching device circuit 403b (switching device circuit 403) are housed in the first semiconductor package 407. The first semiconductor package 407 is replaceably mounted on a step-down chopper circuit body 400a.

According to the fourth embodiment, in the first semiconductor package 407 and the second semiconductor packages 208a and 208b, a distance D41 between a plurality of mounting portions 471 and distances D21 (see FIG. 2) between pluralities of mounting portions 81 are different from each other in a direction parallel to an X-axis. Furthermore, in the first semiconductor package 407 and the second semiconductor packages 208a and 208b, a distance D42 between the plurality of mounting portions 471 and distances D22 (see FIG. 2) between the pluralities of mounting portions 81 are different from each other in a direction parallel to a Y-axis.

The first switching device circuit 403a includes a first switching device 431a and a diode 432a connected in anti-parallel to the first switching device 431a. The second switching device circuit 403b includes a second switching device 431b and a diode 432b connected in anti-parallel to the second switching device 431b.

When a voltage that exceeds a resistance level is applied to gates of the first switching device 431a and the second switching device 431b due to malfunction of a control circuit 206, both the first switching device 431a and the second switching device 431b possibly fail.

When one (the first switching device 431a, for example) of the first switching device 431a and the second switching device 431b has a short-circuit fault in the step-down chopper circuit 400, a current continues to flow into the failing one so that the other (the second switching device 431*b*) of the first switching device 431*a* and the second switching device 431*b* may fail (a value of a current that flows in the other exceeds a short circuit resistance) due to this current. In other words, when one of the first switching device 431*a* and the second switching device 431*b* fails, the other of the first switching device 431*a* and the second switching device 431*b* may also fail. The possibility that both the first switching device 431*a* and the second switching device 431*b* fail simultaneously is relatively high (as compared with the possibility that both diodes 241*a* and 241*b* fail simultaneously).

When the first switching device 431*a*, the second switching device 431*b*, the diode 432*a*, and the diode 432*b* each include a silicon semiconductor, an increase in replacement costs can be suppressed as compared with the case where the same each include a wide band gap semiconductor even if the device(s) that requires no replacement is replaced.

According to the fourth embodiment, both the first switching device 431*a* (first switching device circuit 403*a*) and the second switching device 431*b* (second switching device circuit 403*b*) are housed in the first semiconductor package 407 in response to the above failure mode in which the possibility that both the first switching device 431*a* and the second switching device 431*b* fail simultaneously is high.

As shown in FIG. 8, the first semiconductor package 407 includes the mounting portions 471 and terminals 472*a* to 472*d*. The first semiconductor package 407 is replaceably mounted on the step-down chopper circuit body 400*a* by the mounting portions 471.

The terminals 472*a* and 472*c* are connected to the first switching device circuit 403*a*. The terminals 472*b* and 472*d* are connected to the second switching device circuit 403*b*. The step-down chopper circuit 400 includes wires 409*a* to 409*h*, and a circuit configuration shown in FIG. 7 is formed by connections of the wires 409*a* to 409*h*.

The remaining structures of the step-down chopper circuit 400 according to the fourth embodiment are similar to those of the step-down chopper circuit 200 according to the second embodiment. The remaining operation of the step-down chopper circuit 400 according to the fourth embodiment is similar to that of the step-down chopper circuit 200 according to the second embodiment.

[Effects of Fourth Embodiment]

According to the fourth embodiment, the following effects can be obtained.

According to the fourth embodiment, as hereinabove described, both the first switching device circuit 403*a* and the second switching device circuit 403*b* are housed in the first semiconductor package 407. Thus, as compared with the case where the first switching device circuit 403*a* and the second switching device circuit 403*b* are housed in separate packages, the number of packages is not increased, and hence an increase in the size (complication) of the step-down chopper circuit 400 can be significantly reduced or prevented. Although both the first switching device circuit 403*a* and the second switching device circuit 403*b* are housed in the first semiconductor package 407, replacement of the switching device that requires no replacement can be prevented due to the failure mode in which the possibility that the first switching device 431*a* of the first switching device circuit 403*a* and the second switching device 431*b* of the second switching device circuit 403*b* fail simultaneously is high.

The remaining effects of the step-down chopper circuit 400 according to the fourth embodiment are similar to those of the step-down chopper circuit 100 according to the first embodiment.

[Fifth Embodiment]

The structure of a step-down chopper circuit 500 according to a fifth embodiment is now described with reference to FIGS. 9 and 10. In the fifth embodiment, the step-down chopper circuit 500 is configured as a three-level step-down chopper circuit. Both a first switching device circuit 503*a* and a second switching device circuit 503*b* are housed in a first semiconductor package 407, and both diodes 541*a* and 541*b* are housed in a second semiconductor package 308. Portions of the step-down chopper circuit 500 similar to those of the step-down chopper circuits 100 to 400 according to the aforementioned first to fourth embodiments are denoted by the same reference numerals, to omit the description.

(Structure of Step-Down Chopper Circuit According to Fifth Embodiment)

Figure 9:
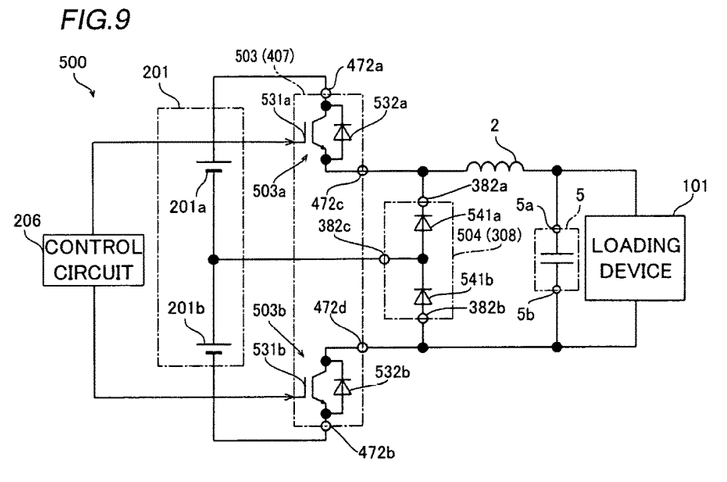
FIG. 9 is an electrical diagram showing the overall structure of a step-down chopper circuit according to a fifth embodiment of the present invention.
Figure 10:
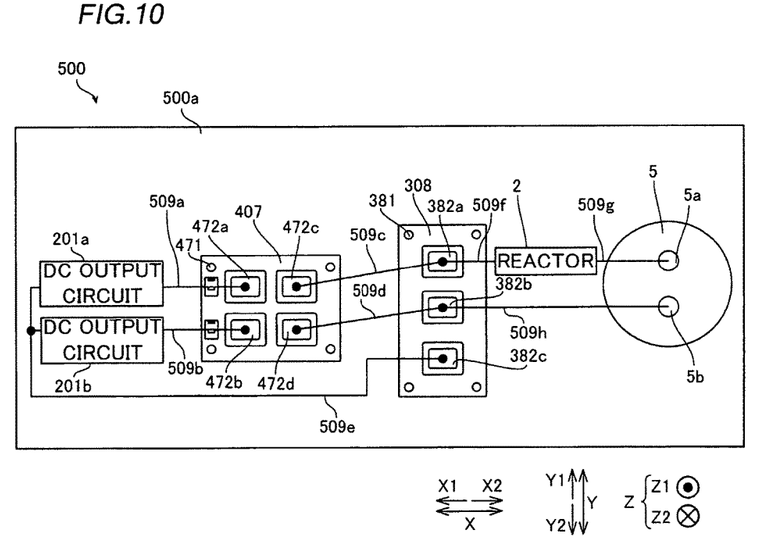
FIG. 10 is a plan view schematically showing the structure of the step-down chopper circuit according to the fifth embodiment of the present invention.

As shown in FIGS. 9 and 10, the step-down chopper circuit 500 according to the fifth embodiment includes the first semiconductor package 407 and the second semiconductor package 308. Both the first switching device circuit 503*a* and the second switching device circuit 503*b* (switching device circuit 503) are housed in the first semiconductor package 407. Both the diodes 541*a* and 541*b* (backflow prevention diode circuit 504) are housed in the second semiconductor package 308.

The first semiconductor package 407 and the second semiconductor package 308 have different shapes from each other, and are replaceably mounted on a step-down chopper circuit body 500*a*.

As shown in FIG. 10, the step-down chopper circuit 500 includes wires 509*a* to 509*h*, and a circuit configuration (three-level step-down chopper circuit) shown in FIG. 9 is formed by connections of the wires 509*a* to 509*h*.

The remaining structures and operation of the step-down chopper circuit 500 according to the fifth embodiment are similar to those of the step-down chopper circuit 200 according to the second embodiment.

[Effects of Fifth Embodiment]

According to the fifth embodiment, the following effects can be obtained.

According to the fifth embodiment, as hereinabove described, both the first switching device circuit 503*a* and the second switching device circuit 503*b* are housed in the first semiconductor package 407, and both the diodes 541*a* and 541*b* are housed in the second semiconductor package 308. In the fifth embodiment, the possibility of failure of the diodes 541*a* and 541*b* is lower than the possibility of failure of the first switching device 531*a* and the second switching device 531*b*, as described in the aforementioned third embodiment. Therefore, replacement of the diodes (wide band gap semiconductors) that require no replacement can be prevented even when both the diodes 541*a* and 541*b* are housed in the second semiconductor package 308, similarly to the step-down chopper circuit 300 according to the third embodiment.

The remaining effects of the step-down chopper circuit 500 according to the fifth embodiment are similar to those of the step-down chopper circuit 100 according to the first embodiment.

[Modification]

The embodiments disclosed this time must be considered as illustrative in all points and not restrictive. The range of the present invention is shown not by the above description of the embodiments but by the scope of claims for patent, and all modifications within the meaning and range equivalent to the scope of claims for patent are further included.

For example, while the step-down chopper circuit is configured as the two-level step-down chopper circuit or the three-level step-down chopper circuit in each of the aforementioned first to fifth embodiments, the present invention is not restricted to this. More specifically, the step-down chopper circuit may alternatively be configured as a four-or-more-level step-down chopper circuit.

While the first semiconductor package(s) and the second semiconductor package(s) have the different shapes from each other in each of the aforementioned first to fifth embodiments, the present invention is not restricted to this. In the case of a manufacturing method or replacement method in which the first semiconductor package(s) and the second semiconductor package(s) are unlikely to be mistakenly mounted on the step-down chopper circuit body, for example, the first semiconductor package(s) and the second semiconductor package(s) may alternatively have the same shape (outer shape).

While the first semiconductor package(s) and the second semiconductor package(s) have the different widths from each other in a plan view, as shown in FIG. 2, as an example in which the first semiconductor package(s) and the second semiconductor package(s) have the different shapes from each other in each of the aforementioned first to fifth embodiments, the present invention is not restricted to this. For example, a difference in shape between the first semiconductor package(s) and the second semiconductor package(s) is not restricted to a difference in width (size), but may alternatively be a difference in any aspect so far as the same is visually recognizable.

While the switching device(s) includes the silicon semiconductor in each of the aforementioned first to fifth embodiments, the present invention is not restricted to this. For example, as in a modification shown in FIG. 1, a switching device 631 may include a wide band gap semiconductor. Thus, the switching device 631 that includes the wide band gap semiconductor is used such that a switching loss can be reduced as compared with the case where the switching device 31 that includes the common silicon semiconductor is used. Consequently, a power loss can be reduced when the step-down chopper circuit 100 is driven. Also in this case, the diode 32 that is connected in anti-parallel to the switching device 31 includes the silicon semiconductor such that replacement of the diode 32 that requires no replacement and includes a relatively expensive wide band gap semiconductor can be prevented when the switching device 31 fails, unlike the case where the diode 32 includes the wide band gap semiconductor.

What is claimed is:

1. A step-down chopper circuit comprising:
   a step-down chopper circuit body including
     a reactor; and
     a capacitor circuit connected to the reactor;
   a first semiconductor package that includes a plurality of first through-holes to detachably fasten the first semiconductor package on the step-down chopper circuit body with first screws, and a switching device circuit connected in series to a direct-current output circuit; and
   a second semiconductor package that is provided separately from the first semiconductor package, and includes a plurality of second through-holes to detachably fasten the second semiconductor package on the step-down chopper circuit body with second screws, and a backflow prevention diode circuit connected to two ends of the capacitor circuit through the reactor and arranged so that the switching device circuit is connected to the direct-current output circuit between two ends of the backflow prevention diode circuit,
   wherein a distance between the plurality of first through-holes arranged adjacent to each other in a predetermined direction and a distance between the plurality of second through-holes arranged adjacent to each other in the predetermined direction are different from each other.

2. The step-down chopper circuit according to claim 1, wherein the first semiconductor package and the second semiconductor package have different shapes from each other.

3. The step-down chopper circuit according to claim 1, wherein the backflow prevention diode circuit includes a backflow prevention diode that includes a wide band gap semiconductor.

4. The step-down chopper circuit according to claim 1, wherein the switching device circuit includes a wide band gap semiconductor.

5. The step-down chopper circuit according to claim 1, further comprising:
   another first semiconductor package that is provided separately from the first semiconductor package, and
   another second semiconductor package that is provided separately from the second semiconductor package,
   wherein the backflow prevention diode circuit includes a first backflow prevention diode and a second backflow prevention diode connected in series to each other,
   the switching device circuit includes a first switching device circuit connected in series to the first backflow prevention diode and a second switching device circuit connected in series to the second backflow prevention diode,
   the direct-current output circuit includes a first direct-current output circuit and a second direct-current output circuit connected in series to each other,
   the first semiconductor package houses the first switching device circuit and the another first semiconductor package houses the second switching device circuit, and
   the second semiconductor package houses the first backflow prevention diode and the another second semiconductor package houses the second backflow prevention diode.

6. The step-down chopper circuit according to claim 1, wherein the backflow prevention diode circuit includes a first backflow prevention diode and a second backflow prevention diode connected in series to each other,
   the switching device circuit includes a first switching device circuit connected in series to the first backflow prevention diode and a second switching device circuit connected in series to the second backflow prevention diode,
   the direct-current output circuit includes a first direct-current output circuit and a second direct-current output circuit connected in series to each other, and
   both the first switching device circuit and the second switching device circuit are housed in the first semiconductor package, or both the first backflow prevention diode and the second backflow prevention diode are housed in the second semiconductor package.

7. The step-down chopper circuit according to claim 6, wherein both the first backflow prevention diode and the second backflow prevention diode are housed in the second semiconductor package.

8. The step-down chopper circuit according to claim 6, wherein both the first switching device circuit and the second switching device circuit are housed in the first semiconductor package.

9. The step-down chopper circuit according to claim 1, wherein each of the first semiconductor package and the second semiconductor package has a width in a longitudinal direction of the step-down chopper circuit body and a height in a short direction of the step-down chopper circuit body to form a rectangular shape, and
the first semiconductor package has the width longer than that of the second semiconductor package, and the height shorter than that of the second semiconductor package.

10. The step-down chopper circuit according to claim 1, further comprising a loading device connected to the capacitor circuit, and a control circuit connected to the switching device circuit.

11. The step-down chopper circuit according to claim 1, further comprising:
another first semiconductor package that is provided separately from the first semiconductor package, and includes a plurality of another first through-holes and another switching device circuit; and
another second semiconductor package that is provided separately from the second semiconductor package, and includes a plurality of another second through-holes and another backflow prevention diode circuit,
wherein only the first semiconductor package is replaced with the another first semiconductor package when the switching device of the first semiconductor package is disabled, and only the second semiconductor package is replaced with the another second semiconductor package when the backflow prevention diode circuit of the second semiconductor package is disabled, without mistaking the first semiconductor package for the second semiconductor package.

12. The step-down chopper circuit according to claim 1, further comprising a plurality of wires including a first wire, a second wire, a third wire, a fourth wire, a fifth wire, and a sixth wire to connect the direct-current output circuit, the first semiconductor package, the second semiconductor package, the reactor, and the capacitor circuit,
wherein the first semiconductor package includes a first terminal and a second terminal, and the second semiconductor package includes a third terminal and a fourth terminal, and
the first wire extends between a positive pole of the direct-current output circuit and the first terminal, the second wire extends between the second terminal and the third terminal, the third wire extends between the third terminal and one end of the reactor, the fourth wire extends between another end of the reactor and a positive terminal of the capacitor circuit, the fifth wire extends between a negative terminal of the capacitor circuit and a negative pole of the direct-current output circuit, and the sixth wire extends between the fourth terminal and the fifth wire.

* * * * *